US009802195B2

(12) United States Patent
Bramanti

(10) Patent No.: US 9,802,195 B2
(45) Date of Patent: Oct. 31, 2017

(54) RIGID MASK FOR PROTECTING SELECTIVE PORTIONS OF A CHIP, AND USE OF THE RIGID MASK

(71) Applicant: STMICROELECTRONICS S.R.L., Agrate Brianza (IT)

(72) Inventor: Alessandro Paolo Bramanti, Maglie (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/831,072

(22) Filed: Aug. 20, 2015

(65) Prior Publication Data

US 2016/0167046 A1    Jun. 16, 2016

(30) Foreign Application Priority Data

Dec. 15, 2014 (IT) .............................. TO2014A1044

(51) Int. Cl.
*B01L 3/00* (2006.01)
*B29C 35/08* (2006.01)
(Continued)

(52) U.S. Cl.
CPC ....... *B01L 3/50853* (2013.01); *B01J 19/0046* (2013.01); *B01L 3/502707* (2013.01);
(Continued)

(58) Field of Classification Search
CPC ............ B01L 3/50853; B01L 19/0046; B01L 3/502715; B01L 3/502737; B81C 1/00404; B29C 35/0894
See application file for complete search history.

(56) References Cited

U.S. PATENT DOCUMENTS

2009/0232966 A1   9/2009 Kalyankar et al.
2011/0303027 A1* 12/2011 Shirazi ................ B01L 3/50855
                                                                73/866.5
(Continued)

FOREIGN PATENT DOCUMENTS

EP          0784543 A1    7/1997
EP          0784543 B1    4/2000
WO       WO9706013 A1    2/1997

OTHER PUBLICATIONS

Dewez J-L et al: "Adhesion of Mammarian Cells to Polymer Surfaces: from Physical Chemistry of Surfaces to Selective Adhesion on Defined Patterns"., Biomaterials. Elsevier Science Publishers BV., Barking. GB., vol. 19. No. 16. 1998. pp. 1441-1445., XP004161407., ISSN: 0142-9612. DOI: 10.1016/S0142-9612(98)00055-6.

*Primary Examiner* — Jeremy C Flinders
(74) *Attorney, Agent, or Firm* — Seed IP Law Group LLP

(57) ABSTRACT

A rigid mask protects selective portions of a chip including a plurality of wells for biochemical reactions. The rigid mask includes a supporting portion and a plurality of legs, where each leg is provided with a rigid stem and a plate. The plurality of legs are arranged and fixed with respect to the supporting portion in a way aligned to the spatial arrangement of the wells, and are configured in such a way that, when each leg is inserted into the corresponding well, the respective plate covers at least in part the bottom of the well, protecting it during a chemical/physical treatment of side walls of the wells.

20 Claims, 5 Drawing Sheets

(51) Int. Cl.
    *B81C 1/00*     (2006.01)
    *B01J 19/00*     (2006.01)
    *B01L 7/00*     (2006.01)
    *B29C 59/14*     (2006.01)

(52) U.S. Cl.
    CPC .... *B01L 3/502715* (2013.01); *B29C 35/0894* (2013.01); *B81C 1/00404* (2013.01); *B01J 2219/0043* (2013.01); *B01J 2219/00317* (2013.01); *B01J 2219/00427* (2013.01); *B01J 2219/00619* (2013.01); *B01L 7/52* (2013.01); *B01L 2200/02* (2013.01); *B01L 2200/025* (2013.01); *B01L 2200/14* (2013.01); *B01L 2300/0609* (2013.01); *B01L 2300/0636* (2013.01); *B01L 2300/0645* (2013.01); *B01L 2300/08* (2013.01); *B01L 2300/0829* (2013.01); *B01L 2300/12* (2013.01); *B01L 2300/161* (2013.01); *B01L 2300/165* (2013.01); *B01L 2300/1805* (2013.01); *B29C 59/14* (2013.01); *B29K 2995/0093* (2013.01)

(56) References Cited

U.S. PATENT DOCUMENTS

| | | |
|---|---|---|
| 2012/0164748 A1 | 6/2012 | Kanigan et al. |
| 2012/0170608 A1 | 7/2012 | Bianchessi et al. |
| 2012/0187082 A1* | 7/2012 | McGeehan ............ C12M 33/02 216/37 |
| 2013/0004954 A1 | 1/2013 | Bianchessi et al. |

* cited by examiner

RIGID MASK FOR PROTECTING SELECTIVE PORTIONS OF A CHIP, AND USE OF THE RIGID MASK

FIELD OF THE INVENTION

The present invention relates to a rigid mask for protecting selective portions of a chip, and to a use of the rigid mask.

BACKGROUND

Analysis of nucleic acids requires, according to various modalities of recognition, preliminary steps of preparation of a specimen of biological material, amplification of the nucleic material contained therein, and hybridization of individual target or reference strands, corresponding to the sequences sought.

At the end of the preparatory steps, the specimen is examined to check whether amplification has regularly occurred.

According to a methodology referred to as "real-time PCR", the DNA is amplified through appropriately selected thermal cycles, and the evolution of the amplification reactions is detected and monitored by fluorescence throughout the process.

The amplification reactions are conducted in such a way that the strands, which are contained in a recognition chamber provided in a support, include fluorescent molecules or fluorophores. PCR analysers designed to be used for optical reading of the specimens are described in U.S. Patent Application Publications 2012/0170608 and 2013/0004954.

There is a need to provide chips having recognition chambers that have a hydrophilic base portion and a hydrophobic lateral-edge portion. This need is achieved, according to the state of the art, by providing on a chip with a hydrophilic surface a containment structure of hydrophobic material, which defines a plurality of chambers.

In the absence of a hydrophobic confinement, the solution contained in the chambers that includes the biological specimen and the reagents, may assume an excessively peripheral distribution, both at the expense of conditions of reaction, the uniformity of which may be jeopardized to the extent of markedly slowing down or even preventing the reaction altogether, and at the expense of the external detection of the signal.

Consider the case where arranged on a chip, which is provided with a surface of silicon oxide and possibly further treated to improve the hydrophilic nature thereof, is a polycarbonate structure that borders on the reaction chambers. Let moreover each of these chambers be provided with heaters and temperature sensors, or other types of actuators and sensors. Let the system further include external systems for detection of signals that are indicative of the evolution of the reaction itself. It is clear that, in such a configuration, these systems are most effective at the central area of the chambers.

For instance, the heaters will be arranged centrally and will control the temperature with the maximum accuracy in the central area of the drop of fluid in which the reaction occurs, whereas an approximately radial gradient of temperature is to be expected.

In the case where the radial area is affected by a concentration of a considerable percentage of the fluid on account of the insufficient hydrophobicity of the polycarbonate, this may represent a serious obstacle to the proper conduct of the reaction, above all in the case of biological reactions that are very sensitive to the temperature, such as DNA amplification by PCR. Furthermore, in the same example, the sensors for detection of the fluorescence signal will be focused on the central area, where in the case of insufficient volume of fluid the quantitative signal detected might be weakened, causing errors in the estimation of the amount of DNA obtained by PCR.

For instance, it is known to use reactors for generation of a plasma in order to render the polycarbonate surface hydrophobic.

For this purpose, it is, however, expedient to mask the bottom of the reaction chambers in such a way as to preserve the hydrophilic characteristics thereof, or in any case not render them hydrophobic. For this purpose, it is common to use metals, such as aluminium, nickel or chrome, or compounds such as aluminium nitride (AlN) or aluminium oxide ($Al_2O_3$), or again silicon carbonate (SiC) or tantalum pentoxide ($Ta_2O_5$) as the mask. Reference may be made, for example, to Sami Franssila, "Introduction to microfabrication", John Wiley & Sons, Second Edition, p. 138.

The mask is obtained by depositing a metal layer within the reaction chambers for covering the bottom of the chambers themselves by successive steps of deposition and etching, and then proceeding with plasma treatment for rendering the lateral surface of the chambers, which have not been masked, hydrophobic. Finally, the metal mask layer is then removed.

It is evident that the prior art poses serious problems of compatibility and process. In particular, the formation of a metal mask is undesirable because it complicates and lengthens the process steps, and may be a source of contamination for possible electronic devices integrated in the chip itself.

SUMMARY

The present invention provides a rigid mask for protecting selective portions of a chip and a use of the rigid mask that will enable reduction of the risk of reading errors during an analysis.

BRIEF DESCRIPTION OF THE DRAWINGS

For a better understanding of the invention, some embodiments thereof will now be described, purely by way of non-limiting example and with reference to the attached drawings, wherein.

DETAILED DESCRIPTION

Figure 1:
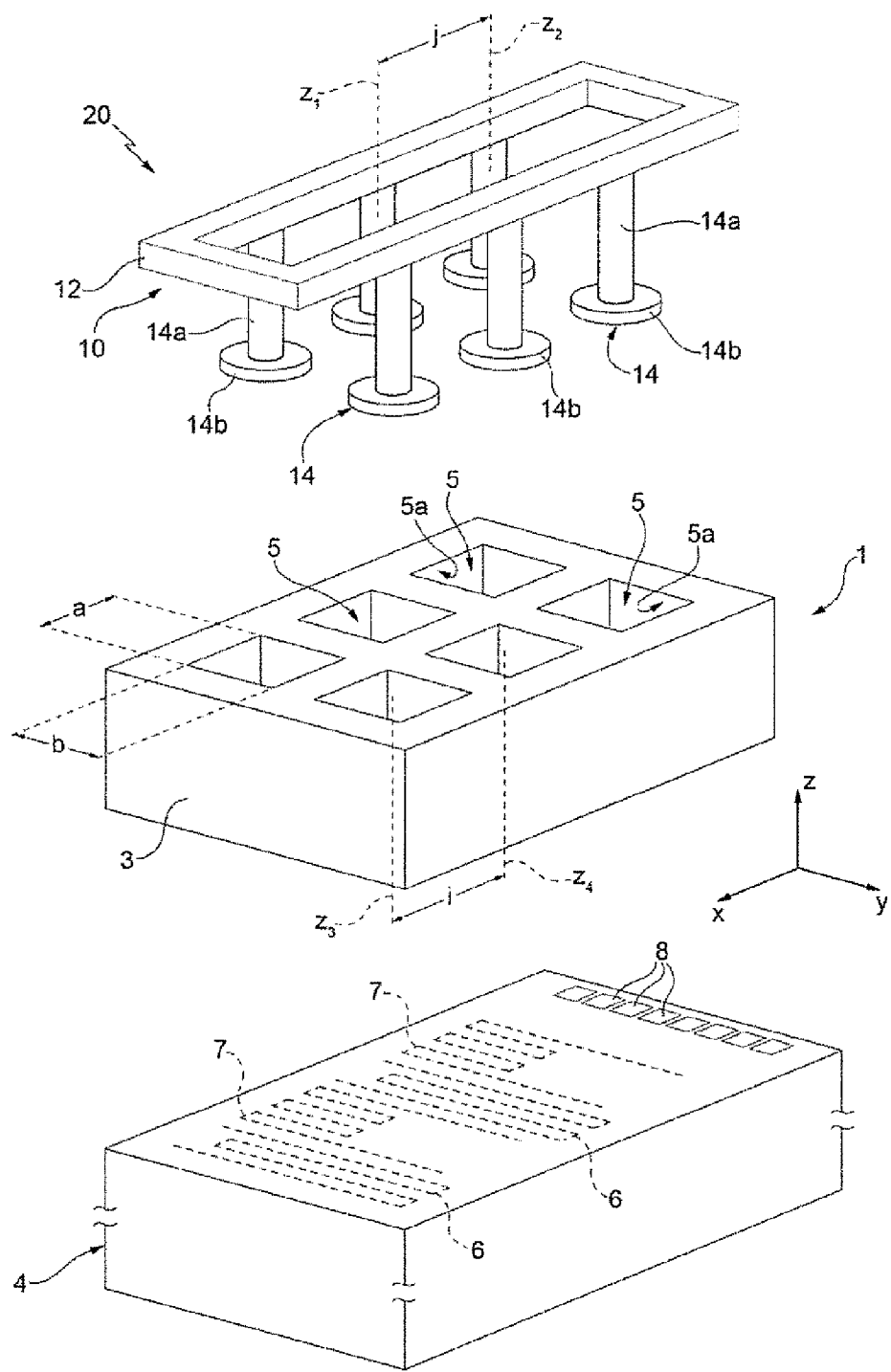
FIG. 1 is an exploded perspective view of a structure including a microreactor, or chip, for biochemical analyses and a rigid mask for selective protection of the chip, according to one embodiment of the present invention.

The exploded view of FIG. 1 shows, as a whole, a structure 20 comprising a chip 1 for biochemical analysis.

The chip 1 comprises a first die 3, for example of polymeric material (e.g., plastic material such as polycarbonate), and a second die 4 of semiconductor material, which are joined together by a coupling layer, such as epoxy glue or some other biocompatible glue. A plurality of wells 5, each delimited by an inner wall 5a, are formed in the first die 3 and are each designed to receive a solution containing biological specimens to be analyzed. The wells 5 have, in top plan view, a generically polygonal shape, for example quadrangular, with sides a and b, measured along axes X and Y, of a length freely chosen in the range of 3-6 mm. The depth c of the wells 5, measured along an axis Z orthogonal to the plane defined by the axes X and Y, is chosen in the range of 2-4 mm. The depth c of the wells 5 is substantially equal to the thickness of the first die 3 in a particular embodiment.

Alternatively, the wells may have a circular or elliptical shape, respectively, with a diameter or axes of dimensions comparable to those of the sides a and b and similar depths.

The wells 5 are arranged, in the plane XY, according to a matrix pattern (in FIG. 1, in particular, a 3×2 matrix), and are separated from one another, in the directions X and Y, by an amount chosen according to the need, in particular for preventing cross contamination between adjacent wells. It is, however, evident that the pattern of arrangement of the wells may differ from a matrix, and may be chosen freely, according to the need.

Figure 2:
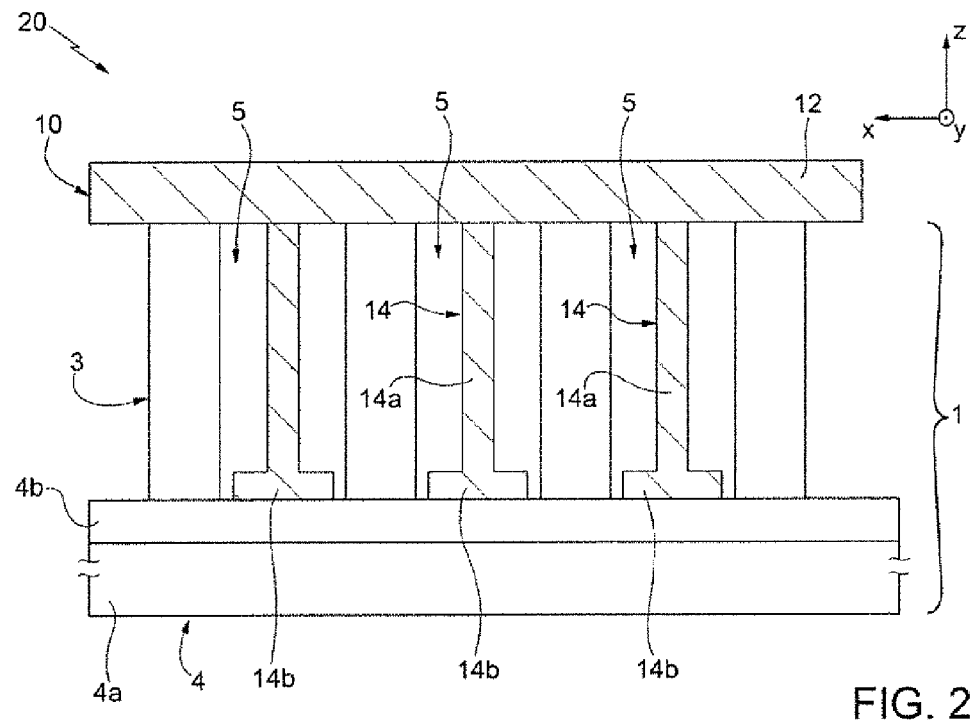
FIG. 2 is a lateral sectional view, along the line of section of FIG. 3 or section V-V of FIG. 4, of the structure of FIG. 1 in which the rigid mask is mounted on the chip.

The second die 4 has, in particular, a body 4a (for example of silicon, Si), and a biocompatible layer 4b (for example of silicon oxide, $SiO_2$) formed on the body 4a, as shown in FIG. 2. The first die 3 is coupled to the second die 4 on the biocompatible layer 4b, in such a way that selective portions of the biocompatible layer 4b are exposed through the wells 5.

According to one embodiment, integrated in the second die 4, in particular in the body 4a, are heaters 6 and on-board temperature sensors 7. The on-board temperature sensors 7 are of a thermoresistive type. In practice, their resistance varies as a function of the temperature, and thus a reading of the resistance indicates the temperature at a given instant. The second die 4 projects slightly on one side with respect to the first die 3 and on the projecting part of the second die 4 houses contact pads 8 to provide regions for electrical coupling of the heaters 6 and of the on-board temperature sensors 7 with a control and read board (not illustrated).

As is known, a method for rendering the inner wall 5a of the wells 5 hydrophobic comprises arranging the chip 1 within a plasma reactor, in a per se known manner.

The aforementioned plasma treatment does not interfere with the portions of the biocompatible layer 4b exposed through the wells 5 in order to not modify the properties thereof. In order to protect the portions of the biocompatible layer 4b exposed through the wells 5, according to an aspect of the present invention, a mask 10 is arranged within each well 5 in such a way as to cover, at least in part, the portions of the biocompatible layer 4b in each well 5 and prevent interaction thereof with the plasma.

In greater detail, the mask 10 is a rigid mask, in particular of metal such as, for example, aluminium or iron. The mask 10 is of a mobile type, i.e., it is inserted within the wells 5 when necessary (during plasma treatment of the inner walls 5a), and removed at the end of the plasma treatment.

Figure 3:
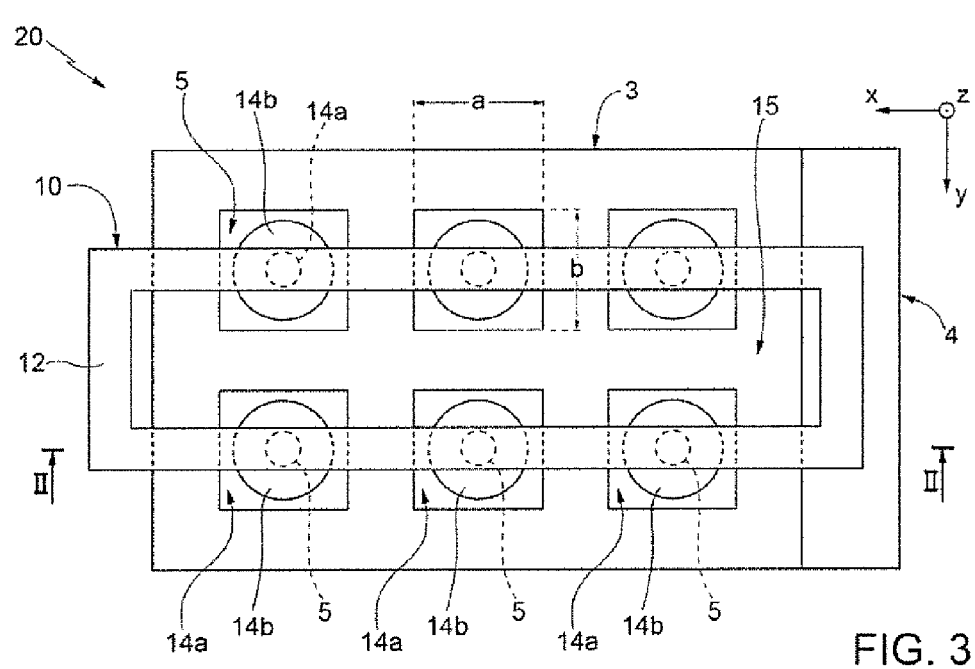
FIG. 3 is a top plan view of the structure of FIG. 2, according to one aspect of the present invention.

According to one embodiment, illustrated by way of example in FIG. 1 (exploded view) and in FIG. 2 (lateral sectional view), the mask 10 is formed by a supporting structure 12 from which a plurality of legs 14 depart, in cantilever fashion. With reference to FIG. 3, in top plan view, it may be noted that the supporting structure 12 has the shape of a generically polygonal, for example rectangular, frame and defines inside a through opening 15. The opening 15 has the function of reducing to a minimum covering of the wells 5 and enabling the plasma to penetrate freely into the wells 5.

Figure 4:
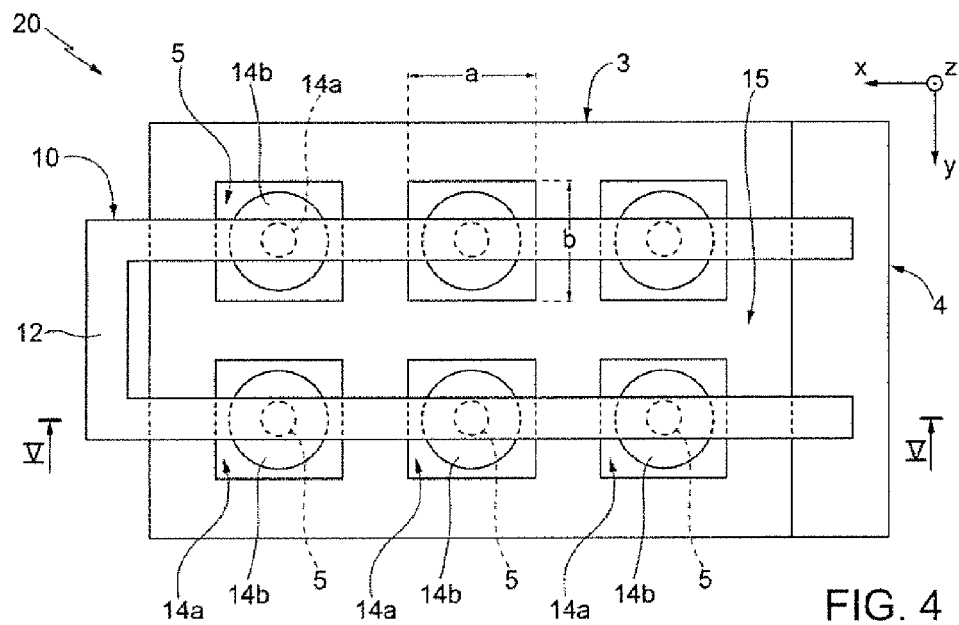
FIG. 4 is a top plan view of the structure of FIG. 2, according to a further aspect of the present invention.

It is evident that other shapes are possible for the supporting structure 12, for example a U-shape, of the type illustrated in FIG. 4, or any other shape chosen according to the configuration and mutual arrangement of the wells of the chip 1.

The legs 14 extend, on the supporting structure 12, according to the same pattern of arrangement of the wells 5 (i.e., in this example, according to a 3×2 matrix), and are spaced apart from one another in such a way that they may each be inserted in a respective well 5. The arrangement of the legs 14 and of the wells 5 is specular (i.e., aligned) in the plane XY.

In other words, for the two legs 14 immediately consecutive to one another along the axis X, the distance j (along X) between the directions $z_1$ and $z_2$, parallel to Z and passing through the respective centroid of the legs 14, is substantially equal to the distance i between the directions $z_3$ and $z_1$, parallel to Z, passing through the respective centroid of the wells 5 in which the respective legs 14 are to be inserted during plasma treatment.

With joint reference to FIGS. 2-4, the legs 14 protrude from the supporting structure 12 at respective portions of the supporting structure 12 in such a way as to be aligned, along the axes X and Y, with respective wells 5 of the chip 1 in at least one operating condition in which the mask 10 and the chip 1 are arranged with respect to one another aligned along the axis Z. In this way, in use, when the mask 10 is arranged on top of the chip 1, there exists a configuration in which each leg 14 is aligned, along Z, with a respective well 5. Insertion of the mask 10 (and in particular of the legs 14) within the wells 5, may be obtained by positioning the mask 10 in such a way that the legs are aligned, along the axis Z, with respective wells 5 and then translating, along Z, the mask 10 until a direct contact of the legs 14 is obtained with the surface 17 of the biocompatible layer 4b exposed via the wells 5. In the case where at least the supporting structure 12 is of ferromagnetic material, the mask 10 may be moved automatically by a magnetic robotized arm.

Figure 5:
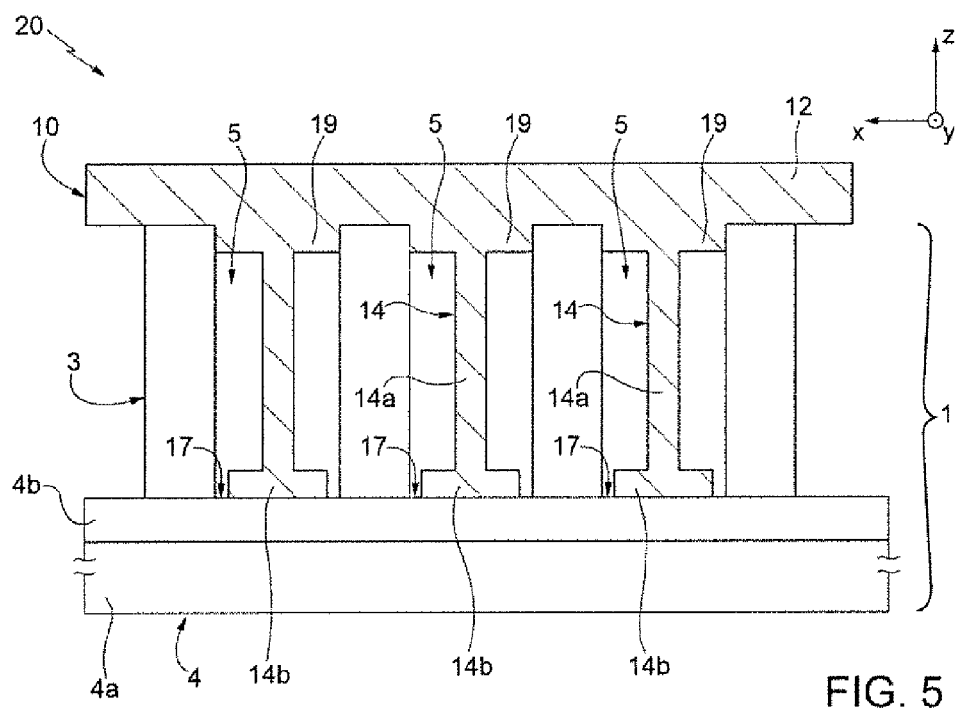
FIG. 5 is a cross-sectional view of the structure of FIG. 1, according to a further aspect of the present invention.

FIG. 5 shows a further embodiment of the mask 10 designed to facilitate alignment thereof with the wells 5. In the case of FIG. 5, the mask 10 further comprises alignment marks 19 in the form of regions with increased thickness that protrude from the supporting structure 12 at the side of the latter that houses the legs 14. In greater detail, the alignment marks 19 extend between the supporting structure 12 and respective legs 14. The alignment marks 19 have a shape and size such as to mate, in at least one direction (e.g., along the axis X), with the top inlet of the wells 5 (i.e., each mark has an extension, along X, equal to the dimension a of the wells 5), and to penetrate into the wells 5 minimally to reduce covering of the inner wall 5a of the wells during plasma treatment. For instance, the alignment marks 19 have a rectangular shape, with extension along the axis Y equal to or smaller than the extension along the same axis Y of the portion of the supporting structure 12 to which they are directly coupled.

With reference to all the embodiments described in FIGS. 1-5, each leg 14 comprises a lengthened portion, or stem portion, 14a, having, for example, a cylindrical or parallelepipedal shape, or some other shape, with dimensions, measured along the axes X and Y, smaller than the respective dimensions a and b, measured along the same axes X and Y, of each well 5. In particular, the dimensions along the axes X and Y of each leg 14 are, for example, approximately one third of the value chosen for the dimensions a (along X) and b (along Y), respectively (or else approximately one third of the transverse dimensions along X-Y, in the case of an elliptical shape) of each respective well 5. Each leg 14 further comprises a contact plate 14b, having a shape, viewed in the plane XY, that is circular or generically polygonal, for example the same shape, in top plan view, as the wells 5. In particular, the maximum dimensions of the contact plate 14b, along X and along Y, are equal to the respective dimensions a (along X) and b (along Y), respectively, of each respective well 5 in the case of a quadrangular well, or else to the diameter or axes thereof in the case of a circular or elliptical shape, or slightly smaller to facilitate insertion of each contact plate 14b into a respective well. In use, in fact, the mask 10 is arranged in such a way that each respective leg 14 extends through a respective well 5 throughout the depth of the well 5, until it reaches and contacts the underlying biocompatible layer 4b.

The legs 14 are, according to one embodiment, made of a single piece with the supporting structure 12. According to a different embodiment, the legs 12 are glued or bonded to the supporting structure 12.

In use, during plasma treatment of the chip 1, provided with the mask 10 arranged as described, the inner wall 5a of each well 5 is rendered hydrophobic in so far as the plasma may circulate freely in the free space inside the wells 5. However, the plasma does not come into contact with the biocompatible layer 4b, in the regions thereof protected by the contact plates 14b of the legs 14.

To ensure a better adhesion between the contact plates 14b and the biocompatible layer 4b, it is possible, according to one embodiment, to exert, during plasma treatment, a pressure on the supporting structure 12, directed along the axis Z towards the second die 4, for example by making the supporting structure 12 of a weight so that it exerts itself the required pressure.

Figure 6:
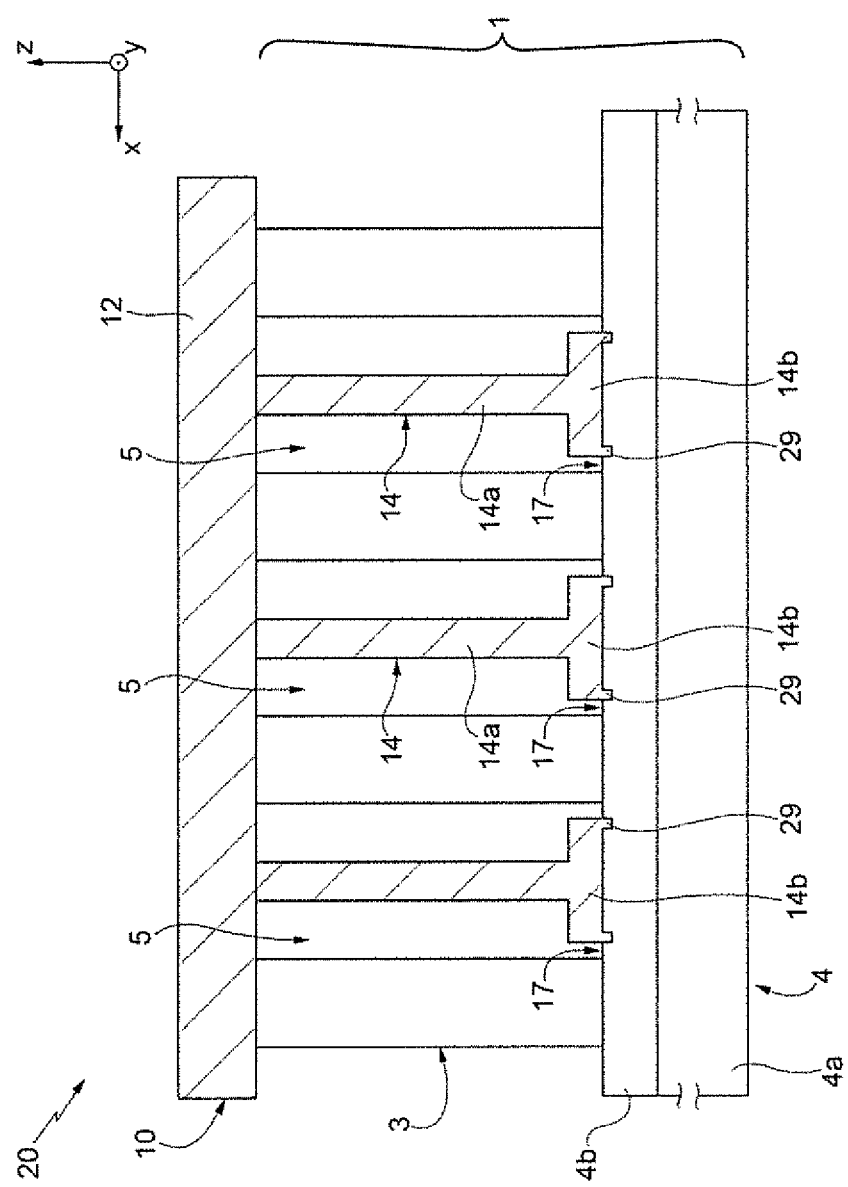
FIG. 6 is a cross-sectional view of the structure of FIG. 1, according to a further embodiment of the present invention.

FIG. 6 shows a further embodiment of the present invention, where coupling between the contact plates 14b of the legs 14 and the biocompatible layer 4b is improved. Elements of the embodiment of FIG. 6 that are in common with those of the previous embodiments described with reference to FIGS. 1-5 are designated by the same reference numbers and are not described further. Furthermore, albeit not illustrated in FIG. 6, the alignment marks 19, described with reference to FIG. 5, may likewise be present.

According to the embodiment of FIG. 6, in the exposed regions of the biocompatible layer 4b (i.e., at each well 5) trenches 24 are dug such as to define a region of depression in each well 5. Each trench 24, or region of depression, forms a seat in which a respective projecting portion of each contact plate 14b may be housed.

Figure 7B:
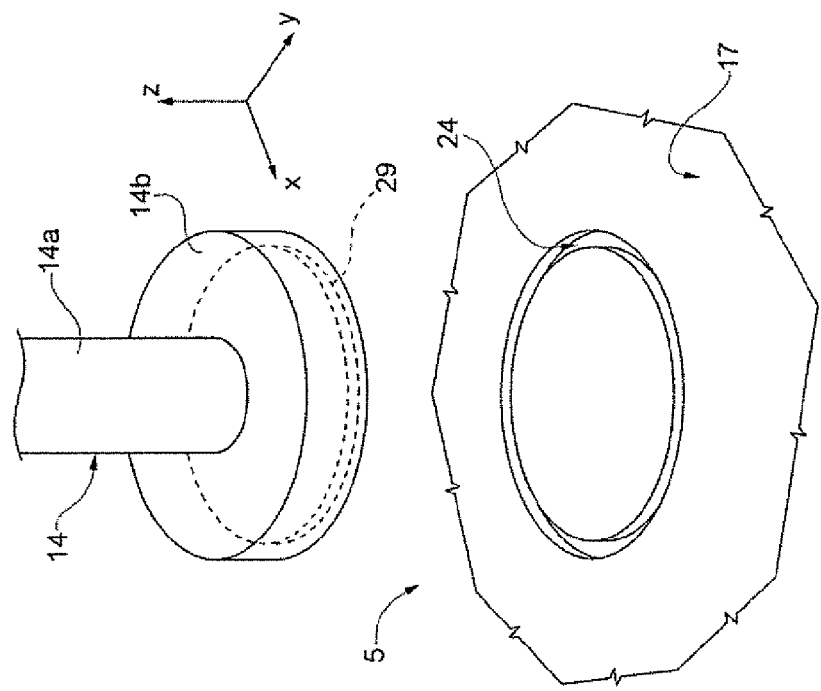
FIG. 7B is a perspective view of the portion of structure of FIG. 7A.
Figure 7A:
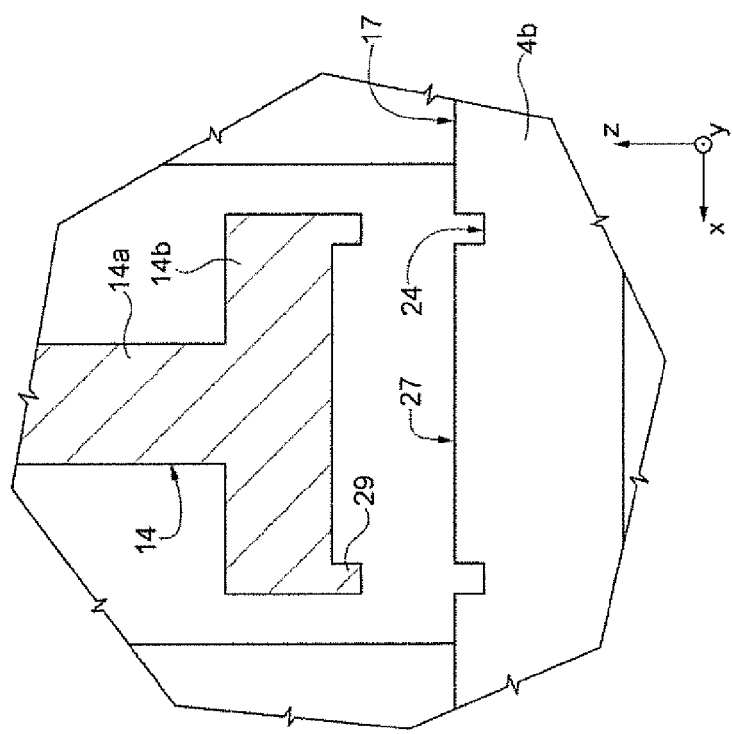
FIG. 7A is an enlarged view of a portion of the structure of FIG. 6.

FIGS. 7A and 7B show, in lateral cross-sectional view and in perspective view, respectively, an enlarged detail of a spatial region inside a well 5, where a trench 24 may be noted, formed in the biocompatible layer 4b, having a circular shape and delimiting, internally, a region 27 of the biocompatible layer 4b.

The contact plate 14b illustrated in FIGS. 7A and 7B is provided with a projecting region 29 having a shape and size compatible with those of the trench 24, i.e., such as to penetrate into the trench 24 offering a complete protection of the inner region 27 during the process of plasma treatment.

In the representation of FIGS. 7A and 7B, the contact plate 14b is at a distance from the biocompatible layer 4b, at an instant in time prior to penetration of the projecting region 29 into the trench 24.

It is evident that the shape of the contact plate 14b may be different from the circular one illustrated in FIGS. 7A and 7B, as likewise the shapes chosen for the trenches 24 and for the projecting region 29 of the contact plate 14b. It is in fact sufficient for the dimensions of the trench 24 and of the contact plate 14b to which it is coupled to be uniform with respect to one another.

The advantages of the present invention emerge clearly from the foregoing description.

In particular, the mask 10 may be reused for a plurality of chip plasma treatments, possibly following upon washing. Furthermore, according to the present invention, the mask 10 is of a rigid and mobile type, and does not require use of metal sacrificial layers and of steps of deposition that might contaminate the substrate or in any case render the process steps long and problematical.

Modifications and variations may be made to the device and to the method described, without thereby departing from the scope of the present invention, as defined in the annexed claims.

For instance, even though what has been described previously refers explicitly to use of the mask 10 for protecting selective portions of the bottom of the wells 5 during a step of treatment of the wells 5 for rendering them hydrophobic, the same mask 10 may be used for protection of the bottom of the wells 5 during a step of treatment of the wells 5 in order to render them hydrophilic, or else, during other types of treatments of the chip 1, such as generic steps of chemical etching using known techniques (e.g., RIE, DRIE, etc.).

Furthermore, even though the figures refer to a chip 1 provided with six wells 5, it is evident that the number of wells may vary according to the need and number less than six or else more than six.

Furthermore, the embodiment of FIG. 1 shows the chip 1 formed by the union of two dice, designated by the reference numbers 3 and 4. It is evident that other embodiments are possible. For example, it is possible to fabricate the chip 1 by bulk micromachining and/or surface micromachining of a wafer of semiconductor material (e.g., silicon), and providing the wells 5 directly in the semiconductor wafer using known chemical-etching steps.

The invention claimed is:

1. A rigid mask for protecting selective portions of a chip for biochemical reactions during a chemical/physical treatment of the chip, wherein the chip includes a plurality of wells where said biochemical reactions are carried out, each well having a bottom and the plurality of wells being arranged according to a pattern, the rigid mask being mobile with respect to the chip in at least a first direction, and comprising:
   a supporting portion; and
   a plurality of legs, each leg comprising a rigid stem and a plate, the rigid stem having a first end fixed to the supporting portion and a second end fixed to the plate, wherein:
      the plurality of legs are configured so that when each leg is inserted in a corresponding well, the respective plate covers at least in part a bottom of the corresponding well to provide protection during the chemical/physical treatment; and
      each stem has dimensions in X and Y directions that are smaller than corresponding dimensions of the plates in the X and Y directions.

2. The rigid mask according to claim 1, wherein the supporting portion and the plurality of legs comprise metal material.

3. A rigid mask according to claim 1, wherein the supporting portion comprises at least a region of ferromagnetic metal material.

4. The rigid mask according to claim 1, wherein the first direction extends parallel to an axis orthogonal to a plane of a bottom of the respective well.

5. The rigid mask according to claim 1, wherein the dimensions of each plate in the X and Y directions are equal to or smaller than corresponding dimensions, of the bottom of the respective well in the X and Y directions.

6. The rigid mask according to claim 1, wherein the bottom of the respective well has a circular or polygonal shape with a respective diameter, and wherein each of the plates has a circular shape with a diameter equal to, or smaller than, the respective diameter of the respective bottom, a polygonal shape with a diameter equal to, or smaller than, the respective diameter of the respective bottom, or oval shape with a major axis equal to, or smaller than, the respective diameter of the respective bottom.

7. The rigid mask according to claim 1, wherein the supporting structure is shaped so that when each leg is inserted in the corresponding well, the well is fluidically accessible.

8. The rigid mask according to claim 7, wherein the supporting structure comprises at least one through opening so that the plurality of wells are fluidically accessible through said through opening.

9. The rigid mask according to claim 1, wherein the bottom of each well comprises a trench that extends according to a trench path, and
wherein each plate comprises a projecting region that extends conformably to the trench path and is configured to penetrate into the trench when the respective plate covers at least in part the bottom of the respective well.

10. The rigid mask according to claim 4, further comprising a plurality of alignment marks arranged between the supporting structure and a respective leg and each have, in the plane of the bottom of the respective well, a spatial extension such as to enable insertion of the alignment mark in the respective well and a respective area smaller than an area of an inlet section of the respective well.

11. The rigid mask according to claim 4, wherein the dimensions of the rigid stem in the X and Y directions are smaller than corresponding dimensions, of the respective well.

12. A rigid mask for protecting selective portions of a chip for biochemical reactions during a chemical/physical treatment of the chip, the rigid mask comprising:
a supporting portion configured to move in a first direction relative to the chip;
a plurality of legs, each leg comprising a rigid stem and a plate, the rigid stem having a first end fixed to the supporting portion and a second end fixed to the plate, wherein:
the plurality of legs are configured so that when each leg is inserted in a corresponding well of the chip, the respective plate covers and protects at least in part a bottom of the corresponding well during the chemical/physical treatment; and
each plate comprises a projecting region that is configured to penetrate into a corresponding trench of the corresponding well when the respective plate covers at least in part the bottom of the corresponding well.

13. The rigid mask according to claim 12, wherein the first direction extends parallel to an axis orthogonal to a plane of the bottom of the corresponding well.

14. The rigid mask according to claim 13, wherein each plate has dimensions equal to or smaller than dimensions of the corresponding well, measured in the plane of the bottom of the corresponding well.

15. The rigid mask according to claim 13, wherein the supporting structure being shaped so that when each leg is inserted in the corresponding well, the corresponding well is fluidically accessible.

16. A rigid mask according to claim 13, wherein the supporting structure comprises at least one through opening so that the plurality of wells are fluidically accessible through said through opening.

17. The rigid mask according to claim 13, wherein each stem has dimensions in X and Y directions that are smaller than corresponding dimensions of the plates in the X and Y directions.

18. A structure, comprising:
a chip for biochemical reactions, the chip including a plurality of wells; and
a rigid mask for protecting selective portions of a chip for biochemical reactions during a chemical/physical treatment of the chip, the rigid mask including:
a supporting portion configured to move in a first direction relative to the chip;
a plurality of legs configured to be inserted respectively in corresponding wells of the plurality of wells, each leg including a rigid stem and a plate, the rigid stem having a first end fixed to the supporting portion and a second end fixed to the plate, wherein:
the plurality of legs are configured so that when each leg is inserted in the corresponding well of the chip, the respective plate covers and protects at least in part a bottom of the corresponding well during the chemical/physical treatment;
the bottom of each corresponding well comprises a trench, and
each plate comprises a projecting region that is configured to penetrate into the trench when the respective plate covers at least in part the bottom of the corresponding well.

19. The structure according to claim 18, wherein the supporting structure comprises at least one through opening so that the plurality of wells are fluidically accessible through said through opening.

20. The structure according to claim 18, wherein each stem has dimensions in X and Y directions that are smaller than corresponding dimensions of the plates in the X and Y directions.

* * * * *